United States Patent
Amano

(10) Patent No.: US 6,411,556 B1
(45) Date of Patent: Jun. 25, 2002

(54) SEMICONDUCTOR MEMORY DEVICE WITH IMPROVED LAYOUT AND REDUNDANCY DETERMINING CIRCUITS

(75) Inventor: Teruhiko Amano, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/667,510

(22) Filed: Sep. 22, 2000

(30) Foreign Application Priority Data

Sep. 30, 1999 (JP) .......................................... 11-279235

(51) Int. Cl.[7] .............................................. G11C 29/00
(52) U.S. Cl. ...................... 365/200; 365/63; 365/230.03
(58) Field of Search ........................... 365/200, 230.03, 365/189.01, 230.01, 63

(56) References Cited

U.S. PATENT DOCUMENTS

| 5,359,560 A | 10/1994 | Suh et al. |
|---|---|---|
| 5,461,587 A | 10/1995 | Oh |
| 5,841,708 A * | 11/1998 | Nagata ........................ 365/200 |
| 6,041,006 A * | 3/2000 | Tsuchiya ..................... 365/210 |
| 6,094,382 A * | 7/2000 | Choi et al. .................. 365/200 |

FOREIGN PATENT DOCUMENTS

| JP | 6-223594 | 8/1994 |
| JP | 6-325589 | 11/1994 |
| JP | 7-192491 | 7/1995 |

* cited by examiner

*Primary Examiner*—Hoai V. Ho
(74) *Attorney, Agent, or Firm*—McDermott, Will & Emery

(57) ABSTRACT

A row including a defective memory cell is replaced by a row of redundant memory cell, independently in each of a pair of memory blocks on opposing sides of a pair of row decoders 11. A redundancy determining circuit 1 for performing the replacement is provided for each memory block, and in the redundancy determining circuit 1, a plurality of fuse boxes 2 are arranged. Accordingly, as the fuses are laid-out in efficient manner, a semiconductor memory device is provided in which the circuits can be effectively arranged on the chip.

8 Claims, 15 Drawing Sheets

US 6,411,556 B1

SEMICONDUCTOR MEMORY DEVICE WITH IMPROVED LAYOUT AND REDUNDANCY DETERMINING CIRCUITS

BACKGROUND OF THE INVENTION

1. Field of the Invention

The present invention relates to a semiconductor memory device and, more specifically, to a semiconductor memory device in which a redundancy determining circuit and the like are laid-out efficiently.

2. Description of the Background Art

An example of a conventional semiconductor memory device having redundant memory cells and a redundancy determining circuit will be described.

FIG. 15 is a block diagram representing a configuration of a conventional semiconductor memory device. FIG. 16 shows a specific configuration of a memory block, in which a memory block 113.0 is shown as an example.

Mainly referring to FIG. 15, the conventional semiconductor memory device mainly includes a pair of memory mats MM in the left and right of the figure, a row related circuitry, a row control circuit, a column decoder 115 and a data input/output buffer 116.

Memory mat MM is divided into memory blocks 113.0, 113.1, . . . , 113.m having a plurality of memory cells arranged in a matrix of rows and columns. Memory blocks 113.0, 113.1, . . . , 113.m respectively have normal memory blocks 113.0a, 113.1a, . . . , 113.ma and redundant memory blocks 113.0b, 113.1b, . . . , 113.mb.

Mainly referring to FIG. 16, normal memory block 113.0a has a plurality of normal memory cells MC arranged in a matrix of rows and columns, and redundant memory block 113.0b has a plurality of redundant memory cells RMC arranged in a matrix of rows and columns. A normal word line WL is connected to gates of normal memory cells MC which are arranged in one same row. The normal word line WL is connected to a normal word driver 112a. A redundant word line RWL is connected to. gates of redundant memory cells RMC arranged in one same row, and the redundant word line RWL is connected to a redundant word driver 112b. The normal memory cells MC and redundant memory cells RMC arranged in the same row are connected to either one of a pair of bit lines BLP, which pair of bit lines BLP are connected to sense amplifier bands 114.0 and 114.1 on the upper and lower portions in the figure.

Mainly referring to FIG. 15, sense amplifier bands 114.0, 114.1, . . . , 114.n are arranged on opposing sides of the plurality of memory blocks 113.0, 113.1, . . . , 113.m, providing a shared sense amplifier scheme. The sense amplifier bands 114.0, 114.1, . . . , 114.n each has a sense amplifier sensing and amplifying data on a column of corresponding memory block when activated.

The row related circuitry is arranged along the longer side of memory mat MM in that area which is between the left and right memory mats MM, and performs operations related to selection of a row of memory cells. The row related circuitry has a row decoder 111 and a word driver 112 provided corresponding to each of memory blocks 113.0, 113.1, . . . , 113.m, and a redundancy determining circuit 101, provided one for each of the pair of left and right memory blocks.

Each row decoder 111 includes a normal row decoder 111a selecting a normal word line WL in the normal memory block, and a redundant row decoder 111b selecting a redundant word line RWL in the redundant memory block. Each word driver 112 has a normal word driver 112a activating a selected normal word line WL, and a redundant word driver 112b activating a selected redundant word line RWL.

Redundancy determining circuit 101 includes, as shown in FIG. 17, a fuse 102a, an NMOS (N channel Metal Oxide Semiconductor) transistor 103, and a redundancy determining signal generating circuit 104. NMOS transistor 103 is connected between a line of ground potential (GND) and redundancy determining signal generating circuit 104, and receives at its gate any of master address signals X4 to X19. Between NMOS transistor 103 and redundancy determining signal generating circuit 104, fuse 102a is connected. The plurality of fuses 102a are arranged in a column, constituting a fuse box 102.

Mainly referring to FIG. 15, the row control circuit has a row predecoder 117 and a row address buffer 118.

Row address buffer 118 outputs a row address signal in response to an external address signal. Row predecoder 117 outputs, based on the output of row address buffer 118, master address signals X4 to X19 which are predecode signals for designating a word line WL.

Data input/output buffer 16 performs signal communication between data I/O pin and each memory block, under the control of column decoder 115.

The master address signals X4 to X19 output from row predecoder 117 are applied to respective redundancy determining circuits 101 over a line extending by the length in the longitudinal direction of the row related circuitry. Further, the master address signals X4 to X19 are passed to a repeater 141 (FIGS. 16, 17) through a line branching from the line extending in the lengthwise direction to be local address signals, which are applied to a normal row decoder 111a.

The row selecting operation in the conventional semiconductor memory device will be described in the following.

Referring to FIG. 15, row address buffer 118 outputs a row address signal in response to an external address signal.

Row predecoder 117 outputs, based on the output of row address buffer 118, master address signals X4 to X19 for designating a word line WL. The master address signals X4 to X19 are applied to redundancy determining circuit 101, and local address signals from the master address signals X4 to X19 are applied to normal row decoder 111a.

By the master address signals, a sense amplifier which is in contact with the selected memory block is disconnected from non-selected memory blocks, and an equalizing circuit, which is precharging the potential of the bit lines of the memory block at an intermediate potential VBL, is canceled.

Redundancy determining circuit 101 determines whether redundancy is to be used/not to be used, based on master address signals X4 to X19. When the redundancy is to be used, a normal word line WL including a defective memory cell MC in FIG. 16 is set to a non-selected state, and a redundant word line RWL connected to redundant memory cell RMC to the selected state. The specific operation is as follows.

When there is a defective memory cell MC in the normal memory block, a fuse 102 corresponding to the row address of the defective memory cell MC is blown off (disconnected) by laser trimming (LT) or the like in advance.

Therefore, when the normal word line WL which is activated is not at an address to be replaced by the redundant word line RWL, the fuse 102a corresponding to that address is not blown off. Therefore, when the master address signals X4 to X19 corresponding to the address are input to redundancy determining circuit 101, nodes A and B are short-circuited to GND through NMOS transistor 103, and attain to L level.

When the normal word line WL to be activated is at the address which is to be replaced by the redundant word line RWL, the fuse 102a corresponding to the address has been blown off. Therefore, even when master address signals X4 to X19 corresponding to that address are input to redundancy determining circuit 101, nodes A and B do not attain to the L level but are kept at the H level.

Dependent on the potential levels of nodes A and B, the redundancy determining signal is generated by redundancy determining signal generating circuit 104. Based on the redundancy determining signal and the like, normal row decoder 111a sets the normal word line WL including the defective memory cell MC to non-selected state, and redundancy row decoder 111b selects the redundant word line RWL. Thus the normal word line WL including the defective memory cell MC is replaced by the redundant word line RWL, and the defect is repaired.

In the conventional semiconductor memory device, only one redundancy determining circuit 101 is provided for a pair of memory blocks on the left and right sides of the figure, with row decoder 111 positioned therebetween, as shown in FIGS. 15 to 17. Therefore, when there is a defective memory cell MC in the memory block on the right side of the figure, for example, and the fuse 102a is programmed (blown) to replace the normal word line WL connected to the defective memory cell MC with the redundant word line RWL, the normal word line WL of the same address in the memory block on the left side of the figure has been replaced with redundant word line RWL simultaneously.

In this configuration, however, when there are defective memory cells MC on normal word lines WL of different addresses in the left and right memory blocks, one of the defects cannot be repaired, so that the whole chip must be discarded as defective.

In order to repair larger number of defective memory cells MC within the memory blocks to obtain chips operating normally, it is necessary to prepare larger number of redundant memory cells RMC and to prepare fuses 102a corresponding in number to the redundant memory cells RMC. The fuses 102a, however, are portions which may be blown off by laser trimming, and therefore the fuses 102a cannot be arranged close to each other. Therefore, though the memory cells MC and sense amplifier bands and the like associated therewith can be reduced in size generation by generation along with the progress in microprocessing technique, the fuse box 102 cannot be made smaller.

SUMMARY OF THE INVENTION

An object of the present invention is to provide a semiconductor memory device in which fuses are laid-out efficiently, so that circuits are arranged effectively on a chip.

According to an aspect of the present invention, the semiconductor memory device includes a pair of row decoders, a pair of memory blocks and a redundancy determining circuit. The pair of memory blocks are arranged on opposing sides of a pair of row decoders. Each of the pair of memory blocks include a plurality of normal memory cells arranged in a matrix of rows and columns, and a plurality of redundant memory cells arranged at least in one row. The redundancy determining circuit performs replacement of a row of the normal memory cells including a defective memory cell by a row of redundant memory cells, independently in each of the pair of memory blocks.

In the semiconductor memory device, the redundancy determining circuit replaces a defective memory cell independently in each of the pair of memory blocks on opposing sides of the row decoder. Therefore, even when there are defects at rows of different addresses in one and the other of the pair of memory blocks, both defects can be repaired independent from each other, and therefore efficiency of repairment is improved.

Preferably, in the semiconductor memory device in accordance with the above described aspect, the redundancy determining circuit has a plurality of fuse groups, each including a plurality of fuses arranged aligned.

As the fuses are arranged not in one train but in a plurality of trains, the length of the fuse group can be shortened, allowing efficient arrangement of the fuses.

Preferably, in the semiconductor memory device in accordance with the above described aspect, the redundancy determining circuit is arranged in an area between the pair of row decoders. A plurality of lines for applying respective ones of the plurality of master address signals for selecting a row of normal memory cells to the redundancy determining circuit are further provided. The plurality of lines include a first line extending in an area between the redundancy determining circuit and one of the pair of memory blocks and connected to the redundancy determining circuit, and a second line extending in an area between the redundancy determining circuit and the other one of the pair of memory blocks and connected to the redundancy determining circuit.

Therefore, even when the fuses of the redundancy determining circuit are arranged in a plurality of trains, it is possible to apply the master address signals to the fuses in the redundancy determining circuit efficiently.

Preferably, in the semiconductor memory device in accordance with the above described aspect, the redundancy determining circuit has a first redundancy determining circuit unit for replacement in one of the pair of memory block, and a second redundancy determining circuit unit for replacement in the other one of the pair of memory blocks. The plurality of lines for applying respective ones of the plurality of address signals for selecting a row of the normal memory cells to the redundancy determining circuit has a center line extending in an area between the first and second redundancy determining circuit units and connected to the first and second redundancy determining circuit units.

Thus, even when the redundancy determining circuit is divided into first and second redundancy determining circuit units for independently performing replacement of defective memory cells in the pair of memory blocks, it is possible to apply master address signals efficiently to the first and second redundancy determining circuit units.

Preferably, in the semiconductor memory device in accordance with the above described aspect, there are a plurality of blocks in which a pair of memory blocks, a pair of row decoders and a redundancy determining circuit are arranged aligned with each other. The first line is arranged to pass between the redundancy determining circuit and one of the pair of memory blocks in each block. The second line is arranged to pass through the redundancy determining circuit and the other one of the pair of memory blocks in each block. The center line is arranged to pass between the first and second redundancy determining circuit units in each block.

As the first and second lines extend in the area between the memory blocks and the redundancy determining circuit along the lengthwise direction of the redundancy determining circuit, the total length of the first and second lines can be shortened, enabling higher speed of operation.

Preferably, in the semiconductor memory device in accordance with the above described aspect, a repeater is further provided, arranged in an area between adjacent blocks. A branch line branched from the center line is connected through the repeater to row decoders in both of the adjacent one of said blocks.

Thus, it becomes possible to apply the master address signals to the row decoders from the center line extending in an area between the first and second redundancy determining units.

Preferably, in the semiconductor memory device in accordance with the above described aspect, the row decoder in one of the blocks has one side area positioned on the side of the block adjacent to the one of the blocks on one side, and the other area branched from the center line through a repeater located on one side of the one of the blocks. The other side area of the row decoder in one of the blocks is connected to a branch line branched from another center line through a repeater located on the other side of the one of the blocks.

Accordingly, the number of repeaters can be reduced to one half that of the prior art, and therefore gate capacitance of the transistors included in the repeater can be reduced. Further, the total length of the branch lines can be shortened, and hence it becomes possible to reduce the line parasitic capacitance and to suppress line by line variation.

According to another aspect of the present invention, the semiconductor memory device includes a plurality of pads, a circuit for generating a signal having a prescribed characteristic, and a fuse. The fuse is arranged in an area between adjacent ones of the plurality of pads, for tuning characteristic of the signal generated by the circuit.

In the semiconductor memory device, a fuse is arranged between pads where circuits are not much arranged. Therefore, more efficient arrangement of circuits on the chip is possible, as compared when the fuses are arranged in an outer peripheral region of the chip.

Preferably, in the semiconductor memory device in accordance with the above described aspect, the circuit is a reference voltage generating circuit. Thus, efficient arrangement of the circuits is possible when the reference voltage generating circuit is used.

Preferably, in the semiconductor memory device in accordance with the above described aspect, a plurality of blocks each including the pair of memory blocks, the pair of row decoders and the redundancy determining circuit arranged aligned with each other are provided. The semiconductor memory device further includes i) a plurality of lines for transmitting respective the ones of a plurality of address signals for selecting a row of the normal memory cells to the redundancy determining circuit in each of the blocks, ii) a repeater arranged in an area between adjacent ones of the blocks, and iii) a branch line branched from one of the plurality of lines and connected to the row decoders in both of the adjacent ones of the blocks through the repeater.

Preferably, in the semiconductor memory device in accordance with the above described aspect, a plurality of blocks each including the pair of memory blocks, the pair of row decoders and the redundancy determining circuit arranged aligned with each other are provided. The semiconductor memory device further comprises i) a plurality of lines for transmitting respective ones of a plurality of address signals for selecting a row of the normal memory cells to the redundancy determining circuit in each of the blocks, ii) a first repeater located on one side of one of the blocks, and iii) a second repeater located on the other side of the one of the blocks. The row decoder in the one of the blocks includes one side area connected to a branch line branched from one of the plurality of lines through the first repeater and the other side area connected to a branch line branched from the other of the plurality of lines through the second repeater.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in the following with reference to the figures.

First Embodiment

Figure 1:
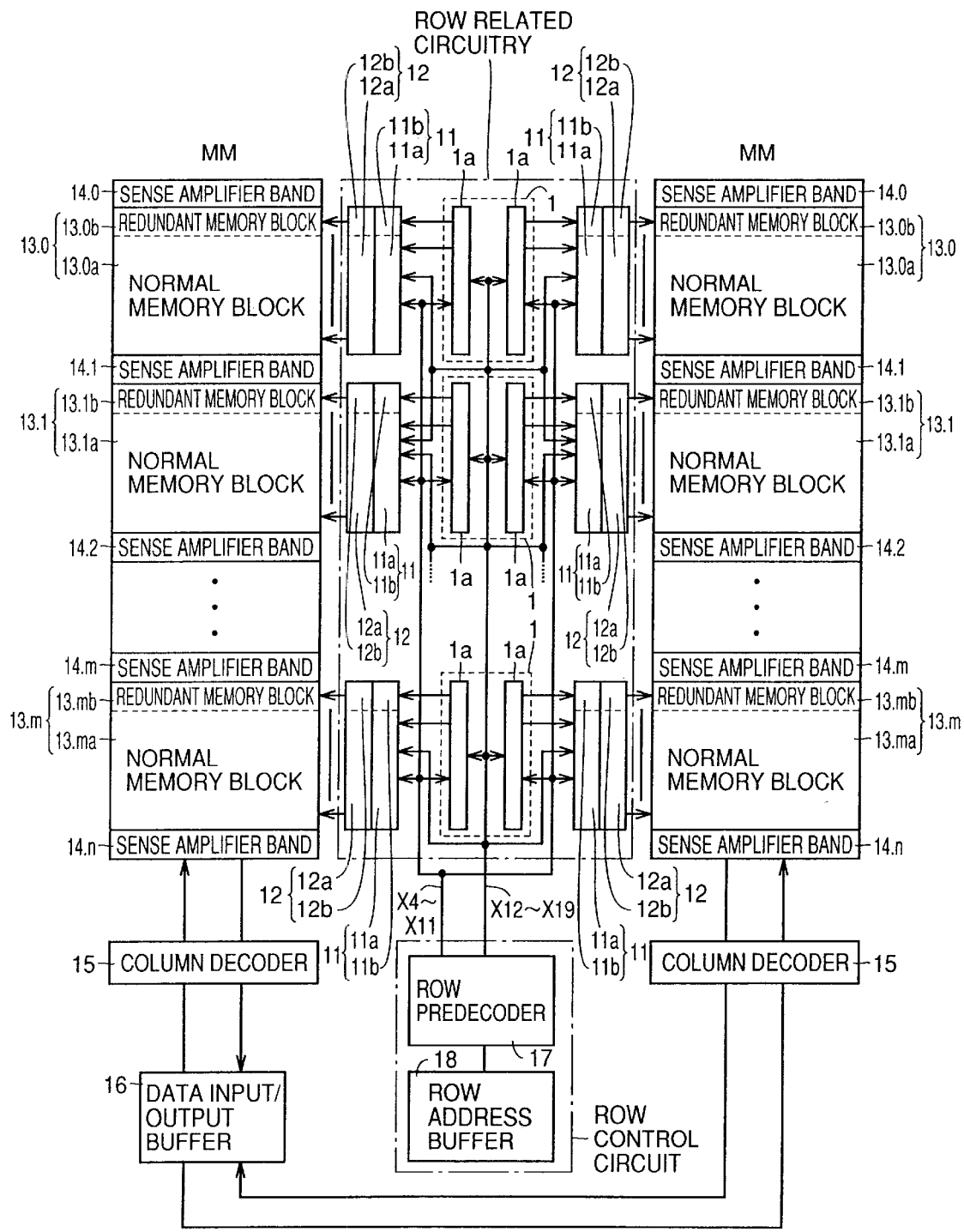
FIG. 1 is a block diagram schematically showing a configuration of a semiconductor memory device in accordance with a first embodiment of the present invention.

Referring to FIG. 1, the semiconductor memory device in accordance with the present embodiment mainly includes a pair of memory mats MM on the left and right portions on the figure, a row related circuitry, a row control circuit, a column decoder 15 and a data input/output buffer 16.

Memory mat MM is divided into a plurality of memory blocks 13.0, 13.1, . . . . 13.m. On opposing sides of memory blocks 13.0, 13.1, . . . , 13.m, sense amplifier bands 14.0, 14.1, . . . , 14.n are arranged, providing a shared sense amplifier scheme. Memory blocks 13.0, 13.1, . . . , 13.m have normal memory blocks 13.0a, 13.1a, . . . , 13.ma and redundant memory blocks 13.0b, 13.1b, . . . , 13.mb, respectively.

The row related circuitry is arranged along the longer side direction of the memory mat MM in an area between the pair of left and right memory mats MM, performing operations related to selection of a row of memory cells in the memory block. The row related circuitry mainly includes a redundancy determining unit 1, a row decoder 11 and a word driver 12.

One row decoder 11 and one word driver 12 are provided for each one of the memory blocks. Row decoder 11 has a normal row decoder 11a for selecting a normal word line in the normal memory block, and a redundant row decoder 11b for selecting a redundant word line in the redundant memory block. Word driver 12 has a normal word driver 12a for activating a normal word line in the normal memory block, and a redundant word driver 12b for activating a redundant word line in the redundant memory block.

Redundancy determining unit 1 determines whether redundancy is to be used/not to be used, and outputs a redundancy determining signal for setting a redundant word line to a selected state, when redundancy is to be used.

Redundancy determining unit 1 has two redundancy determining circuits 1a to the pair of left and right memory blocks. By the redundancy determining circuit 1a, a redundancy determining signal is applied independently to each of the pair of left and right row decoders 11. Therefore, it becomes possible to replace a normal word line by a redundant word line independently in each of the pair of left and right memory blocks.

The row control circuit mainly includes a row predecoder 17 and a row address buffer 18. Row address buffer 18 outputs a row address signal in response to an external address signal. Row predecoder 17 outputs, based on the output from row address buffer 18, master address signals X4 to X19 which are predecode signals for designating a word line. The output master address signals X4 to X19 are applied to redundancy determining circuit 1a and normal row decoder 11a. The master address signals X12 to X19 are turn to local address signals by a repeater and applied to normal row decoder 11a.

Data input/output buffer 16 performs signal communication between data I/O pin and each memory block under the control of column decoder 15.

Figure 2:
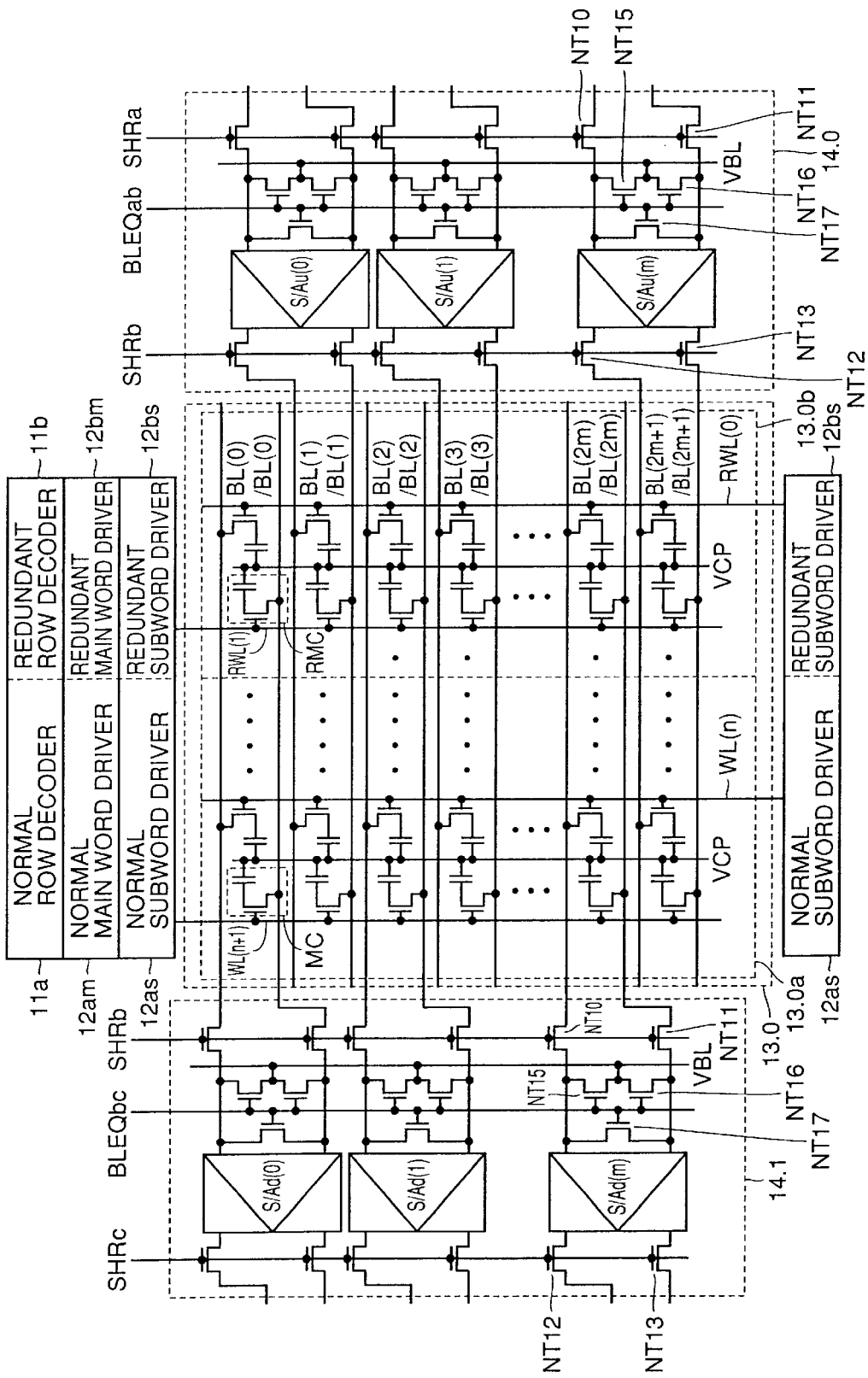
FIG. 2 is a schematic diagram showing configurations of a memory block and a sense amplifier band, showing a memory block 13.0 as an example.

Referring to FIG. 2, normal memory block 13.0a has a plurality of normal memory cells MC arranged in a matrix of rows and columns, and redundant memory block 13.0b includes a plurality of memory cells RMC arranged in a matrix of rows and columns. Each of the normal memory cells MC and of the redundant memory cells RMC has a one transistor-one capacitor configuration.

The normal memory cells MC arranged in one same column in normal memory block 13.0a are connected to one same normal word line WL. The redundant memory cells RMC arranged in one same row in redundant memory block 13.0b are connected to one same redundant word line RWL. The normal memory cell MC and the redundant memory cells RMC arranged in one same column are connected to either one of bit line pair BL and /BL.

The normal word line WL is connected to a normal subword driver 12as, and redundant word line RWL is connected to a redundant subword driver 12bs. Each of pairs of bit lines BL (0) and /BL (0), BL (2) and /BL (2), . . . , BL (2m) and /BL (2m) are respectively connected to sense amplifiers S/Ad (0), S/Ad (1), . . . , S/Ad (m) below the memory block 13.0 in the figure through NMOS transistors NT10 and NT11 receiving at their gates a shared gate signal SHRb. Pairs of bit lines BL (1) and /BL (1), BL (3) and /BL (3), . . . , BL (2m+1) and /BL (2m+1) are respectively connected to sense amplifiers S/Au (0), S/Au (1), . . . , S/Au (m) above memory block 13.0 in the figure, through NMOS transistors NT12 and NT13 receiving at their gates a shared gate signal SHRb.

Sense amplifier band 14.0 or 14.1 includes a plurality of sense amplifiers S/Au (0) to S/Au (m) or S/Ad (0) to S/Ad (m), a plurality of equalizing circuits including NMOS transistors NT15 to NT17, and a plurality of S/A share circuits including NMOS transistors NT10 to NT13. NMOS transistors NT15, NT16 and NT17 equalize NMOS transistors NT10 to NT13 to be precharged to VBL potential, in response to equalize signals BLEQab and BLEQbc. NMOS transistors NT10 to NT13 connect and disconnect bit line pairs and sense amplifiers to and from the memory blocks, in response to shared gate signals SHRa, SHRb and SHRc.

Normal main word driver 12am is to activate a normal main word line, and normal subword driver 12as is to activate a normal subword line WL. Redundant main word driver 12bm is to activate redundant main word line RMWL, and redundant subword driver 12bs is to activate redundant word line RWL. The word lines have hierarchical structure.

Figure 3:
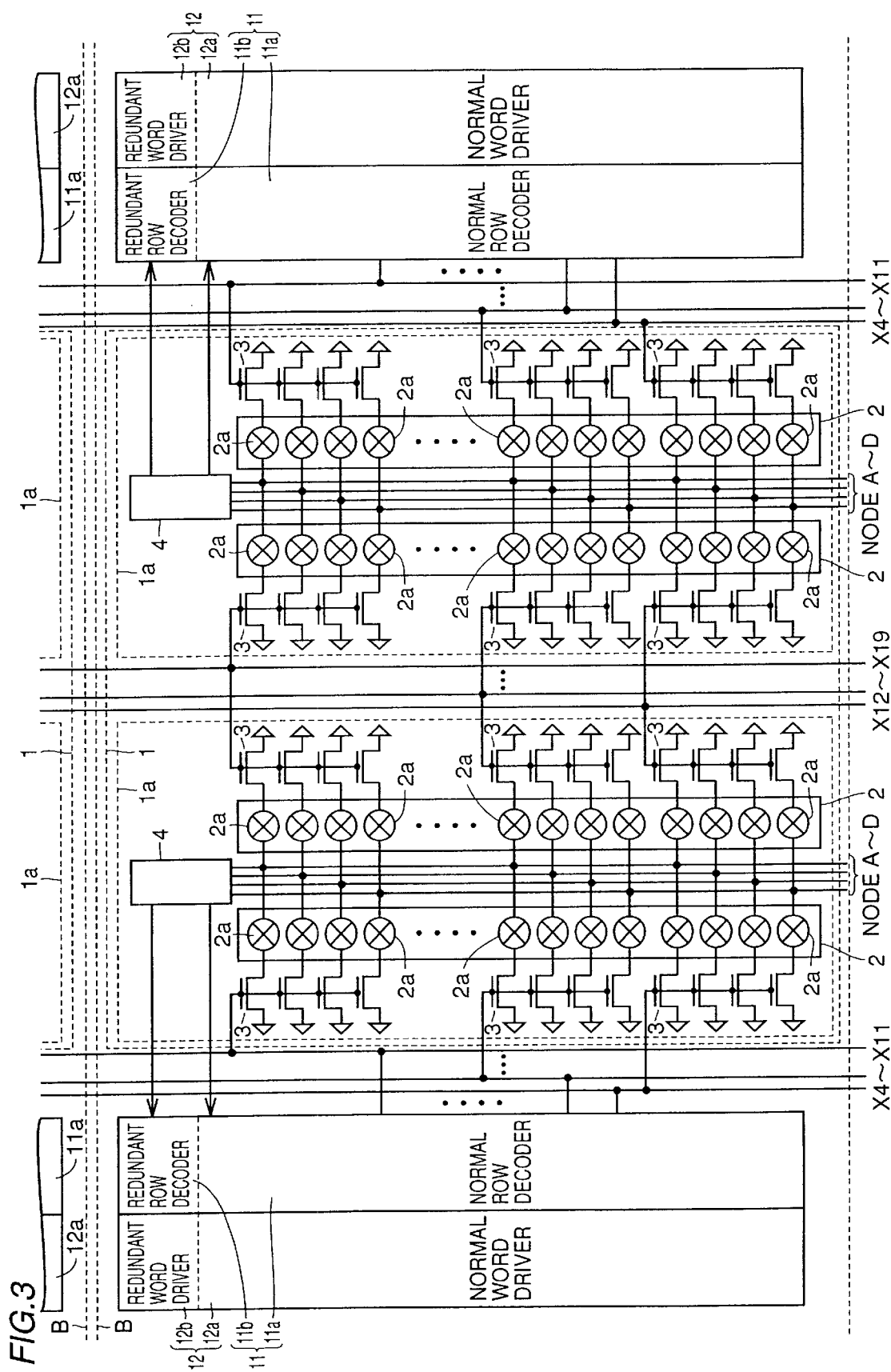
FIG. 3 specifically represents a configuration of the redundancy determining unit.

Referring to FIG. 3, redundancy determining circuit 1a has a plurality of NMOS transistors 3, a plurality of fuses 2a and a redundancy determining signal generating circuit 4. NMOS transistor 3 is connected between a line of the ground potential (GND) and the redundancy determining signal generating circuit 4, and receives as an input any of the master address signals X4 to X19. Between NMOS transistor 3 and redundancy determining signal generating circuit 4, a fuse 2a is connected. A plurality of fuses 2a are arranged in a row, constituting a fuse box 2.

In the redundancy determining unit 1, four sets of fuse boxes 2 are arranged approximately parallel to each other, and two sets of fuse boxes 2 are arranged in one redundancy determining circuit 1a. One of the two sets of fuse boxes 2 correspond to master address signals X4 to X11, and the other one of the two sets of fuse boxes 2 corresponds to master address signals X12 to X19.

The redundancy determining signal obtained from redundancy determining signal generating circuit 4 is input to redundant row decoder 11b, and the signal obtained from redundancy determining signal generating circuit 4 is input to normal row decoder 11a.

For each of the master address signals X4 to X19, four NMOS transistors 3 and four fuses 2a are arranged. Therefore, it is possible to replace four row addresses by four redundant rows independently from each other, in one memory block.

Figure 4:
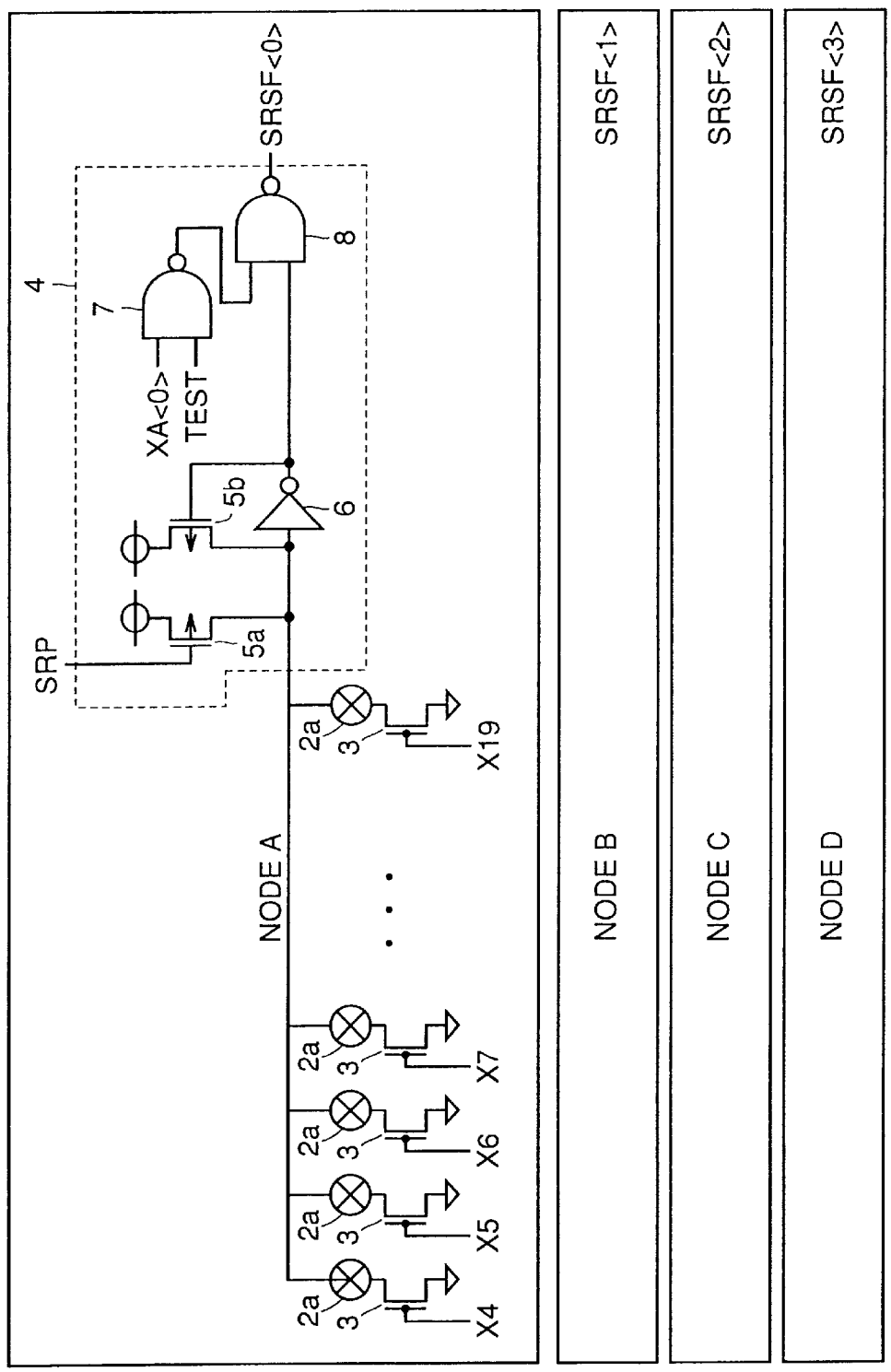
FIG. 4 specifically represents a configuration of the redundancy determining signal generating circuit.

Referring to FIG. 4, a portion corresponding to node A of redundancy determining signal generating circuit 4 includes PMOS transistors 5a and 5b, an inverter 6 and NAND gates 7 and 8. Inverter 6 inverts a signal at node A. PMOS transistors 5a and 5b are connected in parallel between the line of the power supply potential and node A. PMOS transistor 5a receives at its gate a precharge signal SRP, and PMOS transistor 5b receives at its gate an output signal from inverter 6. NAND gate 7 receives a signal XA <0> and a TEST signal. NAND gate 8 receives an output signal from NAND gate 7 and an output signal from inverter 6 and outputs a redundancy determining signal SRSF <0>.

The redundancy determining signal generating circuit for each of nodes B to D has similar configuration as that for node A.

Figure 5:
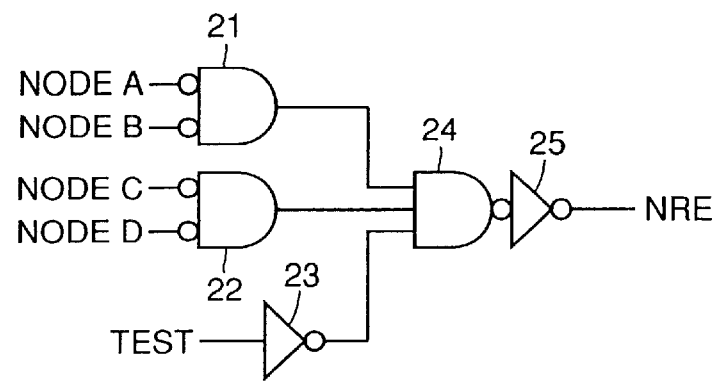
FIG. 5 represents a normal row enable signal generating circuit.

Referring to FIG. 5, an NRE signal generating circuit has NOR gates 21 and 22, inverters 23 and 25, and an NAND gate 24. NOR gate 21 receives signals at nodes A and B. NOR gate 22 receives signals at nodes C and D. Inverter 23 receives the TEST signal. NAND gate 24 receives output signals from NOR gates 21 and 22 and an output signal from inverter 23. An output signal from NAND gate 24 is inverted by inverter 25 to be the signal NRE.

Figure 6:
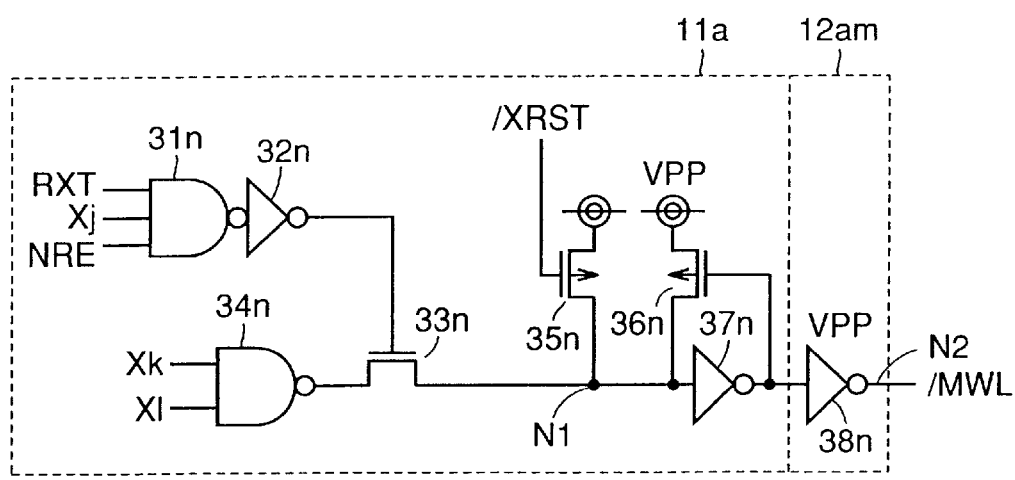
FIG. 6 represents configurations of the normal row decoder and the normal main word driver.

Referring to FIG. 6, normal row decoder 11a includes NAND gates 31n and 34n, inverters 32n and 37n, an NMOS transistor 33n and PMOS transistors 35n and 36n. Normal main word driver 12am has an inverter 38n.

NAND gate 34n receives signals Xl and XM. NMOS transistor 33n is connected between an output node of NAND gate 34n and a node N1. NAND gate 31n receives signals RXT, Xj and NRE, and an output signal thereof is input to the gate of NMOS transistor 33n through inverter 32n. PMOS transistors 35n and 36n are connected in parallel between the line of a boosted potential VPP and node N1. PMOS transistor 35n receives at its gate the signal /XRST. Inverters 37n and 38n are connected in series between node N1 and an output node N2. PMOS transistor 36n receives at its gate an output signal from inverter 37n. The signal appearing at output node N2 is the signal /MWL.

The signal Xj is any of master address signals X4 to X7, the signal Xk is any of master address signals X8 to X11, and the signal Xl is any of local address signals XX12 to XX19 which are derived from master address signals X12 to X19. Thus, 4×4×8=128 different selections of normal main word line is possible.

In order to make a decision of replacement of a row including a defective memory cell by a redundant row, one of four fuses corresponding to master address signals X4 to X7, one of four fuses corresponding to master address signals X8 to X11 and one of eight fuses corresponding to master address signals X12 to X19, that is, a total of three fuses are blown in advance.

Figure 7:
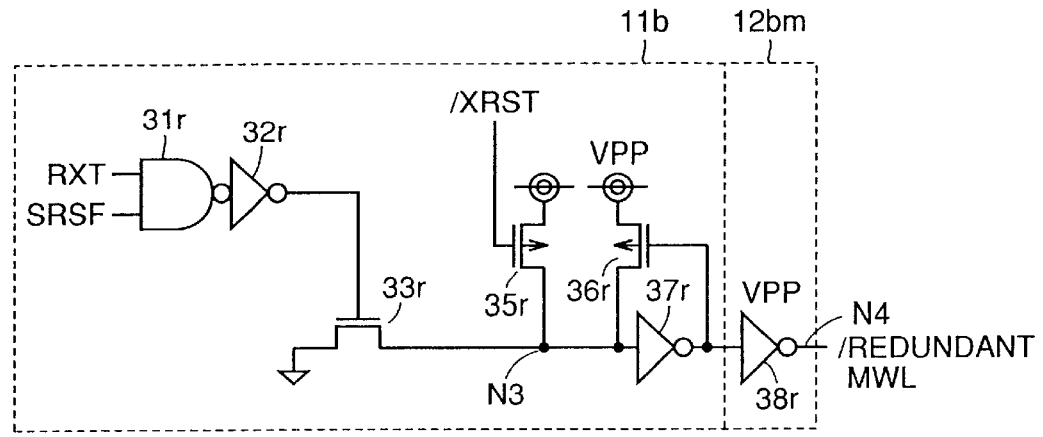
FIG. 7 represents configurations of a redundant row decoder and a redundant main word line driver.

Referring to FIG. 7, redundant row decoder 11b has an NAND gate 31r, inverters 32r and 37r, an NMOS transistor 33r and PMOS transistors 35r and 36r. Redundant main word driver 12bm has an inverter 38r.

NMOS transistor 33r is connected between the line of the ground potential and a node N3. NAND gate 31r receives signals RXT and SRSF, and an output signal thereof is input to the gate of NMOS transistor 33r through inverter 32r. PMOS transistors 35r and 36r are connected in parallel between the line of the boosted potential VPP and node N3. PMOS transistor 35r receives at its gate the signal /XRST. Inverters 37r and 38r are connected in series between node N3 and an output node N4. PMOS transistor 36r receives at its gate an output signal from inverter 37r. The signal appearing at output node N4 is the signal /redundant MWL.

The row selecting operation in the semiconductor memory device in accordance with the present embodiment will be described in the following.

Mainly referring to FIG. 1, row address buffer 18 outputs a row address signal in response to an external address signal. Row predecoder 17 outputs, based on an output of row address buffer 18, master address signals X4 to X19. The master address signals X4 to X19 are input to redundancy determining circuit 1a, and master address signals X4 to X11 and local address signals XX12 to XX19 are input to normal row decoder 11a.

Mainly referring to FIG. 4, when a row activating signal is input, the signal SRP precharging nodes A and B of redundancy determining circuit 1a attains from the L level to the H level, whereby the precharge state is canceled. The reset signal /XRST of normal row decoder 11a and redundant row decoder 11b shown in FIGS. 6 and 7 attains to the H level, whereby reset state is canceled.

Mainly referring to FIG. 4, master address signals X4 to X19 corresponding to the word line to be activated are input to redundancy determining circuit 1a. At this time, when a fuse 2a corresponding to the input master address signals is not blown off, nodes A to D are short-circuited to GND through NMOS transistor 3, and attain to the L level. As nodes A to D are all set to the L level, signals SRSF <0> to <3> attain to the L level, and NRE of FIG. 5 attains to the H level.

Referring to FIG. 6, when the signal RXT activating the word line attains to the H level at an appropriate timing after the end of decoding the master address signals (after precharge state of the memory cells is cancelled), the signal /MWL attains to the L level, and the normal word line is activated. In response to a subdecode signal obtained by decoding master address signals X0 to X3, one normal subword line is activated by the normal subword driver. At this time, the signal /redundant MWL of FIG. 7 attains to the H level, and therefore the redundant main word line is not activated.

Mainly referring to FIG. 4, when the word line to be activated is at the address which is to be replaced by the redundant word line, the fuse 2a corresponding to that address has been blown off, in FIG. 4. Therefore, even when the master address signal is input to redundancy determining circuit 1a, node A does not attain to L level. Thus SRSF <0> attains to the H level, and NRE in FIG. 5 attains to the L level.

Referring to FIGS. 6 and 7, when the signal RXT for activating the word line attains to the H level at an appropriate timing after the end of decoding of the master address signal, the normal main word line is not activated, and the redundant main word line is activated in place of the normal main word line. By the redundant subword driver, one redundant subword line is activated.

In this manner, the row selecting operation is performed in the present embodiment.

In the present embodiment, one redundancy determining circuit 1a is provided for one memory block, as can be seen from FIGS. 1 and 3. Therefore, even when there are defective memory cells at rows of different addresses in one and the other of the pair of memory blocks on both sides of a pair of row decoders 11, the defective memory cells can be repaired independent from each other, whereby efficiency of repairment can be improved.

The layout of the row related circuitry in the present embodiment will be described in the following.

Referring to FIGS. 1 and 3, when a pair of memory blocks, a pair of row decoders 11 and the redundancy determining unit 1 arranged in a line in the figure are considered as one block, a line for master address signals X4 to X11 passes through the memory blocks and the redundancy determining unit 1 of each block, and the line for master address signals X12 to X19 passes between a pair of left and right redundancy determining circuits 1a of each block.

The line for transmitting master address signals X4 to X11 is directly connected to each normal row decoder 11a and redundancy determining circuit 1a. The line for transmitting master address signals X12 to X19 is directly connected to redundancy determining circuit 1a.

Conventionally, only one line for one signal has been arranged in the band of the row related circuitry as the lines transmitting the master address signals X4 to X11. Therefore, when such a line configuration is applied to the configuration of the present embodiment in which one redundancy determining unit 1 has four fuse boxes 2, the configuration is as shown in FIG. 8.

Figure 8:
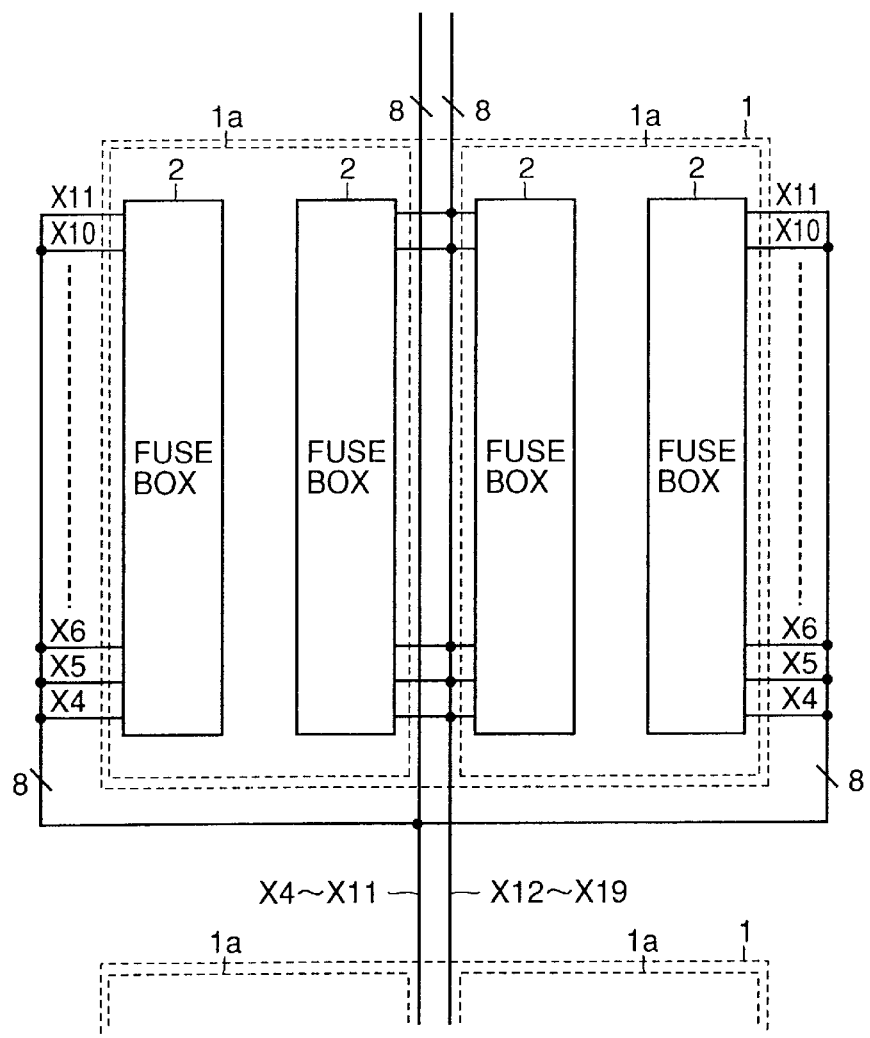
FIG. 8 represents a configuration in which a conventional interconnection structure for master address signals X4 to X11 is applied to a configuration having four fuse boxes.

Referring to FIG. 8, as to the lines for master address signals X4 to X11, one line for one signal extends in the central area between adjacent redundancy determining circuits 1a in the left and right portions in the figure. It is necessary to connect the lines for the master address signals X4 to X11 to the fuse boxes 2 on the opposing ends in the figure, whereas it is not possible to extend the line immediately above the fuse boxes 2. The reason for this is that the fuse 2a arranged in the fuse box 2 is to be blown off by laser irradiation from above. Therefore, for connection to the fuse boxes at the opposing ends, it is necessary to branch the lines for master address signals X4 to X11 to extend around the fuse box 2.

Such an interconnection structure, however, results in long total length of the lines, increasing parasitic capacitance of the lines. This means that the signal delay is increased.

In the present embodiment, not only one line for master address signals X4 to X11 is extended at the center of the redundancy determining unit 1 but one line is provided extending on either side. More specifically, in FIG. 3, a line for master address signals X4 to X11 is arranged passing between redundancy determining unit 1 and row decoder 11.

In the present invention, a "block" refers to a unit including redundancy determining units arranged aligned in the lateral direction in the figure, a pair of row decoders 11, a pair of word drivers 12 and a pair of memory blocks. Therefore, it is the case that a plurality of "blocks" are arranged in the longitudinal/lengthwise direction of the figure.

Figure 10:
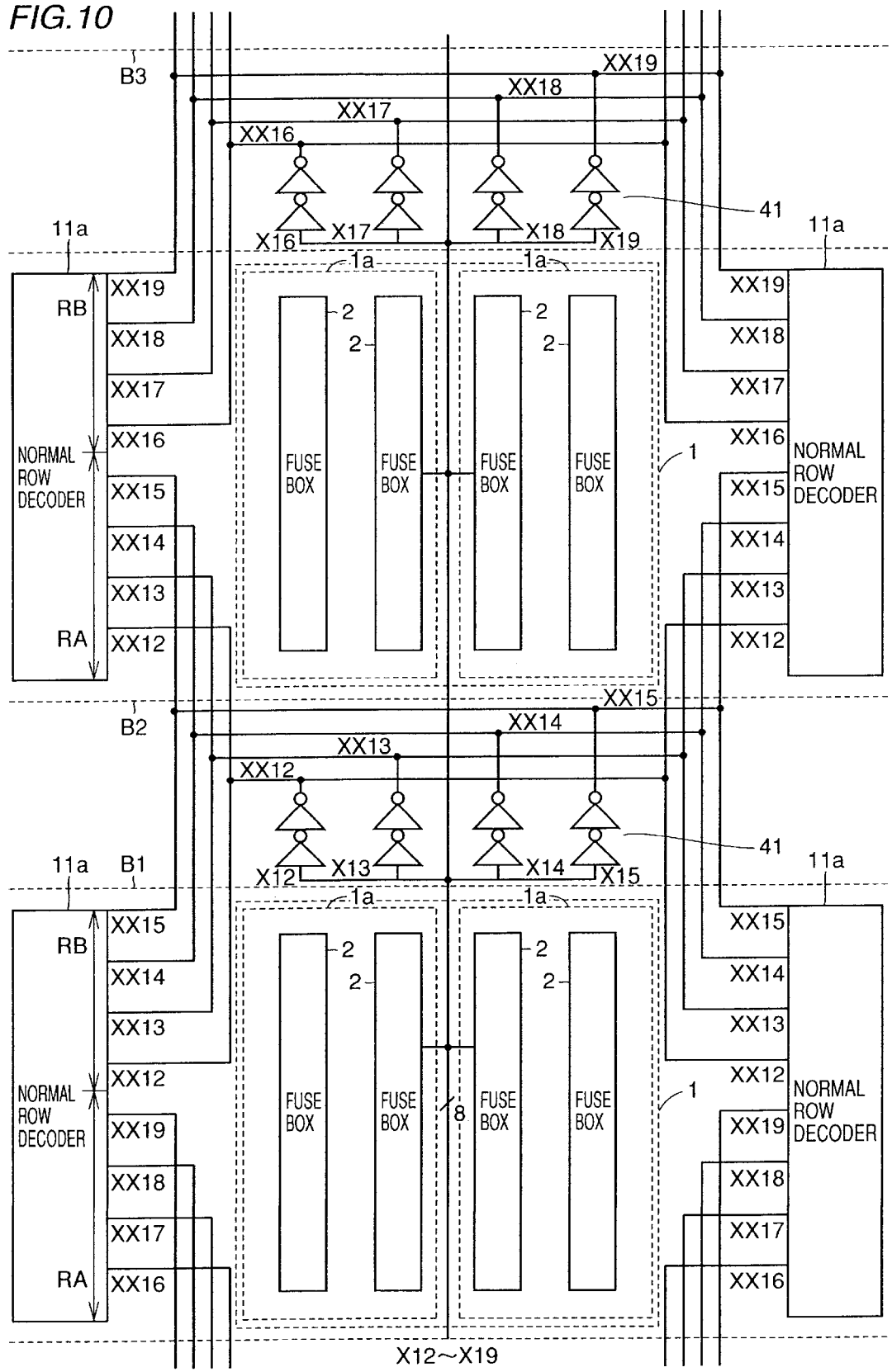
FIG. 10 shows a configuration in which four repeaters are arranged between redundancy determining units adjacent in upper and lower directions.

Referring to FIG. 10, in the present invention, four repeaters 41 corresponding to master address signals X12 to X15 are arranged in that area which is between blocks B1 and B2, and four repeaters 41 corresponding to master address signals X16 to X19 are arranged in that area which is between blocks B2 and B3.

The line for master address signals X12 to X19 extends through the center of redundancy determining unit 1. More specifically, the line for the master address signals X12 to X19 are arranged to pass through that area which is between a pair of redundancy determining circuits adjacent in the lateral direction in the figure, in each block. Therefore, it becomes unnecessary to provide the line around the fuse box 2 for each redundancy determining unit 1. Therefore, the total line length can be shortened than in the structure of FIG. 8, and hence higher speed of operation is attained.

Figure 9:
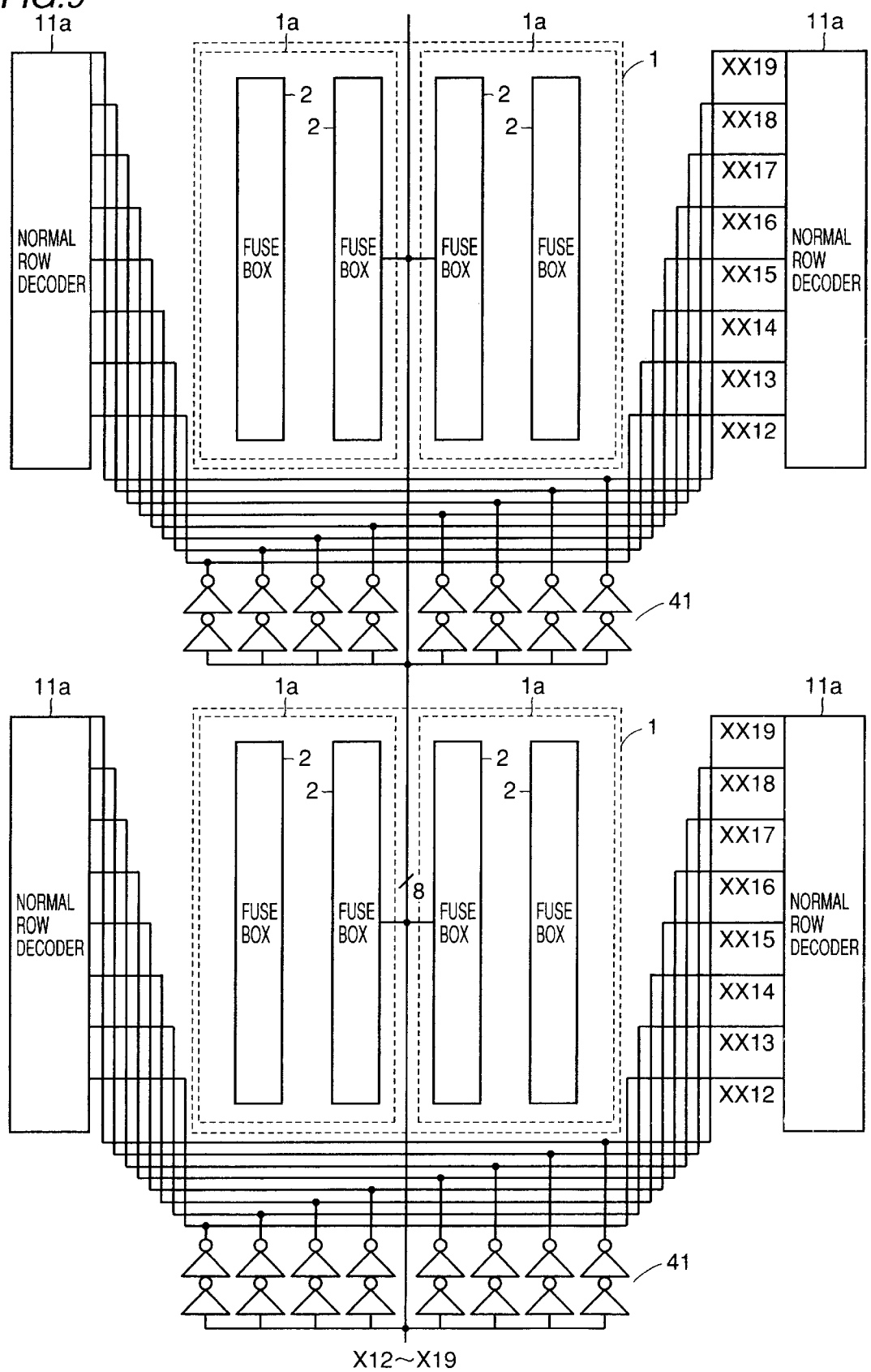
FIG. 9 shows a configuration in which eight repeaters are provided between redundancy determining units adjacent in upper and lower directions.

When the conventional arrangement of master address signals X2 to X19 is applied to the configuration of the present embodiment in which one redundancy determining unit 1 has four fuse boxes 2, the configuration is as shown in FIG. 9.

Referring to FIG. 9, a line for master address signals X12 to X19 extends at the center of redundancy determining unit 1. Conventionally, eight repeaters 41 corresponding to master address signals X12 to X19 are arranged in an area between the redundancy determining unit 1 adjacent in upper and low directions in the figure. The lines are arranged such that the master address signals X12 to X19 are processed to local address signals XX12 to XX19 by the repeaters 41 to be input to normal row decoder 11a. In this case, it is necessary to ensure a space large enough to arrange eight lines for local address signals XX12 to XX19 between normal row decoder 11a and redundancy determining unit 1, and therefore, a wide area is necessary in the lateral direction of the figure. Further, eight repeaters and eight lines are necessary in the area between upper and lower adjacent redundancy determining units 1, and therefore, a wide area is necessary in the lengthwise direction of the figure.

Therefore, in the present embodiment, such a layout of repeaters and the lines as shown in FIG. 10 is implemented. Referring to FIG. 10, in the present embodiment, Referring to FIG. 10, in the present invention, four repeaters 41 corresponding to master address signals X12 to X15 are arranged in that area which is between blocks B1 and B2, and four repeaters 41 corresponding to master address signals X16 to X19 are arranged in that area which is between blocks B2 and B3.

The line for master address signals X12 to X19 extends through the center of redundancy determining unit 1. More specifically, the line for the master address signals X12 to X19 are arranged to pass through that area which is between a pair of redundancy determining circuits adjacent in the lateral direction in the figure, in each block.

The line for master address signal X12 to X19 extending at the center of redundancy determining unit 1 is branched at the one side and the other side ( upper side and lower side in the figure) of the redundancy determining unit 1. The branch line on one side is connected to an area RA on one side of normal row decoder 11a through four repeaters 41 corresponding to master address signals X12 to X15, respectively. The branch line on the other side is connected to an area RB on the other side of normal row decoder 11a through four repeaters corresponding to master address signals X16 to X19, respectively.

The line branched from the line for master address signals X12 to X19 extending in the center is connected to upper and lower to normal row decoders 11a through repeaters 41. Thus local address signals XX12 to XX19 are input to normal row decoder 11a.

By this configuration, the number of repeaters and the lines in the area between upper and lower adjacent redundancy determining units 1 can be reduced to one half (four) that of the configuration shown in FIG. 9, and hence the width in the lengthwise direction of the figure in this area can be made smaller. Further, as the number of repeaters 41 can be reduced, the gate capacitance of the transistor constituting the repeater 41 can also be reduced.

Further, the order of arrangement of the local addresses input to normal row decoder 11a is made different in the upper and lower normal row decoders 11a. More specifically, the address of the line branched on one side of the redundancy determining unit 1 is arranged to the area RA on one side of normal row decoder 11a, while the address of the line branched on the other side of the redundancy determining unit 1 is arranged on the area RB on the other side of normal row decoder 11a. Therefore, overlapping of the lines for local address signals XX12 to XX15 and for address signals XX16 to XX19 in the widthwise direction of the lines can be prevented. Therefore, what is necessary is that the area between normal row decoder 11a and redundancy determining unit 1 is wide enough to allow arrangement of four lines for the local address signals. Therefore, the width in the widthwise direction can be made smaller than in the configuration of FIG. 9.

Further, the length of the line reaching from each repeater 41 to normal row decoder 11a can be made shorter than that in the configuration of FIG. 9, so that the line parasitic capacitance can be reduced and the line by line variation can be suppressed.

As described above, by the configuration of the present embodiment, the row related circuitry configuration superior in area efficiency and electrical characteristic can be obtained.

The repeater 41 is used for suppressing increase in signal delay input to normal the normal row decoder when the line numbers for the master address signal is long, and the repeater is constituted by an inverter.

Second Embodiment

In a recent DRAM (Dynamic Random Access Memory), it is often the case that a power supply voltage for peripheral circuitry and an array voltage for the memory cell portion are set lower by a VDC (Voltage Down Converter) than an external power supply voltage in view of power consumption and reliability. In a VDC, a reference voltage generating circuit is used for generating a voltage lower than the external power supply voltage.

Figure 11:
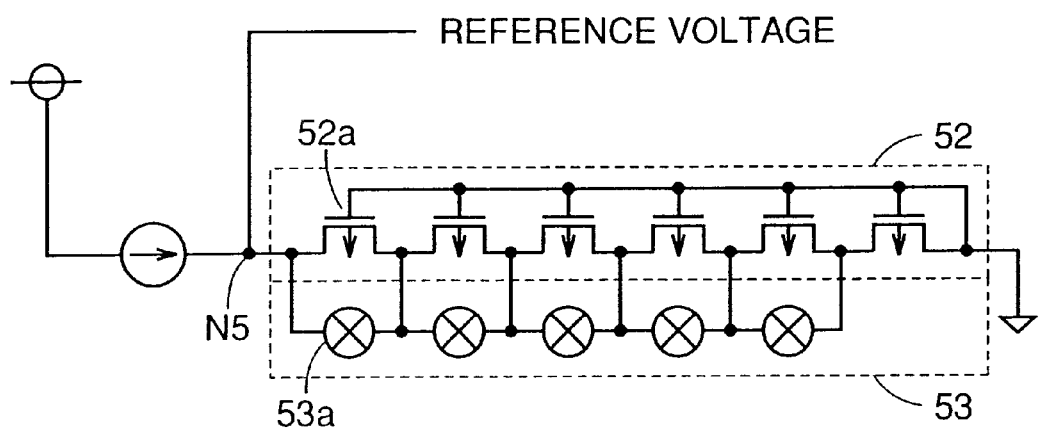
FIG. 11 represents configurations of the reference voltage generating circuit and a fuse for the reference voltage generating circuit.

Referring to FIG. 11, a constant current source is connected to a line of the power supply potential and a node N5, and a plurality of PMOS transistors 52a are connected in series between the node N5 and a line of a prescribed potential (GND). These PMOS transistors 52a constitute the reference voltage generating circuit 52. Each PMOS transistor 52a has its gate connected to the prescribed potential (GND). Between the source and the drain of some of the PMOS transistors 52a, a fuse 53a is connected. The area in which the plurality of fuses 53a are formed is a fuse forming area 53.

The reference voltage generating circuit utilizes voltage drop caused by channel resistance of the transistor. The threshold voltage and the channel resistance of a transistor, however, are susceptible to variation in manufacturing of the semiconductors. Therefore, in such a reference voltage generating circuit as shown in FIG. 11, the fuse 53a is laser-trimmed after manufacturing the semiconductors, so as to suppress variation in manufacturing.

Figure 12:
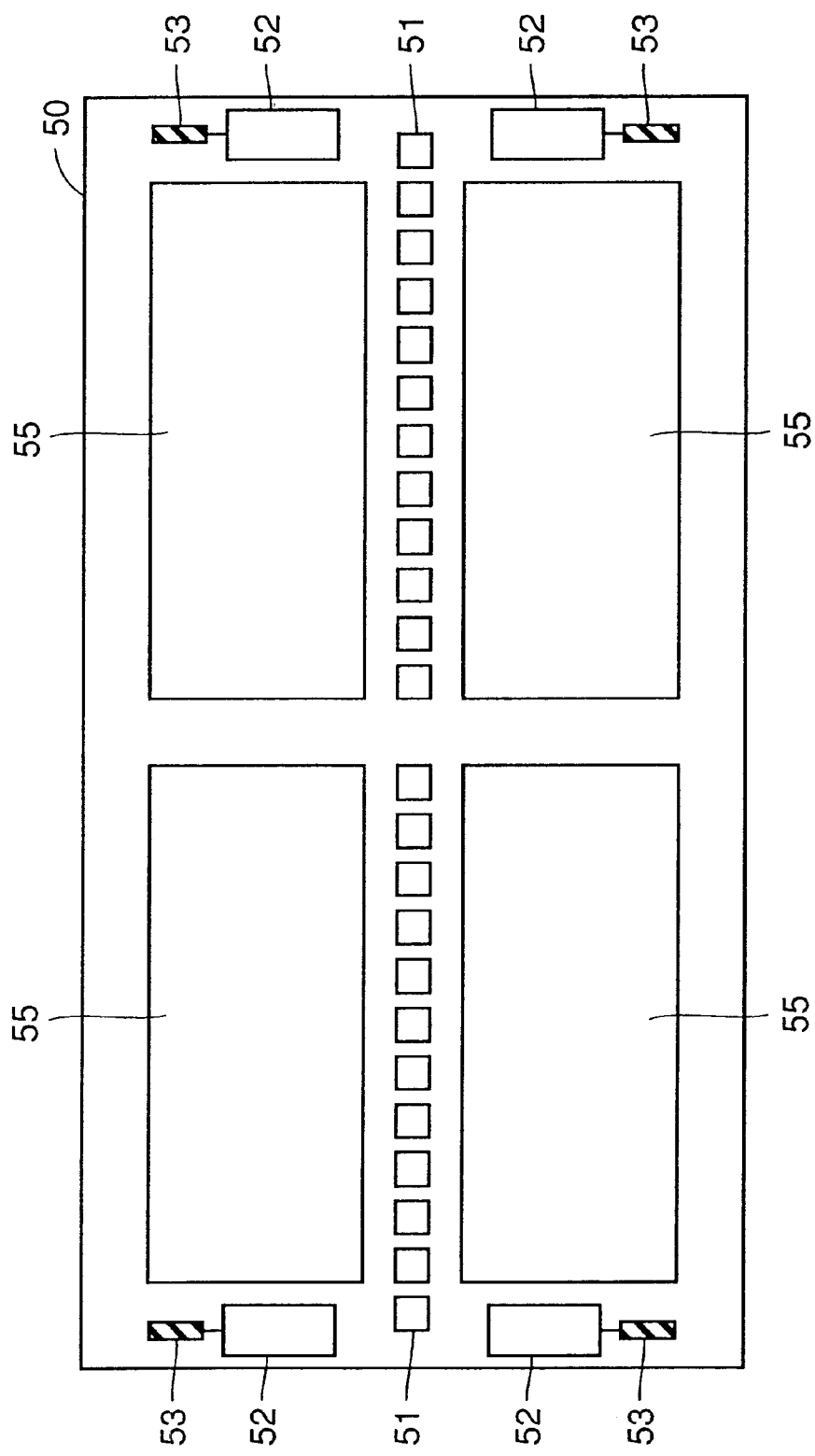
FIG. 12 represents an area for forming fuses for tuning in the conventional power supply circuit.

Referring to FIG. 12, the fuse forming area 53 for tuning has been selected on an outer periphery of a chip 50, together with a circuit 52 such as the reference voltage generating circuit.

Because of the necessity to blow off the fuse 53a by laser trimming or the like, a line cannot be formed over the area where the fuse 53 is arranged. Further, in arranging other circuitry, there is a restriction that the circuit must be arranged at a certain distance from the fuse forming area 53. Therefore, arrangement of the fuse forming area 53 on the outer periphery of chip 50 is not very efficient in arranging other lines and circuits on the outer peripheral region.

Figure 13:
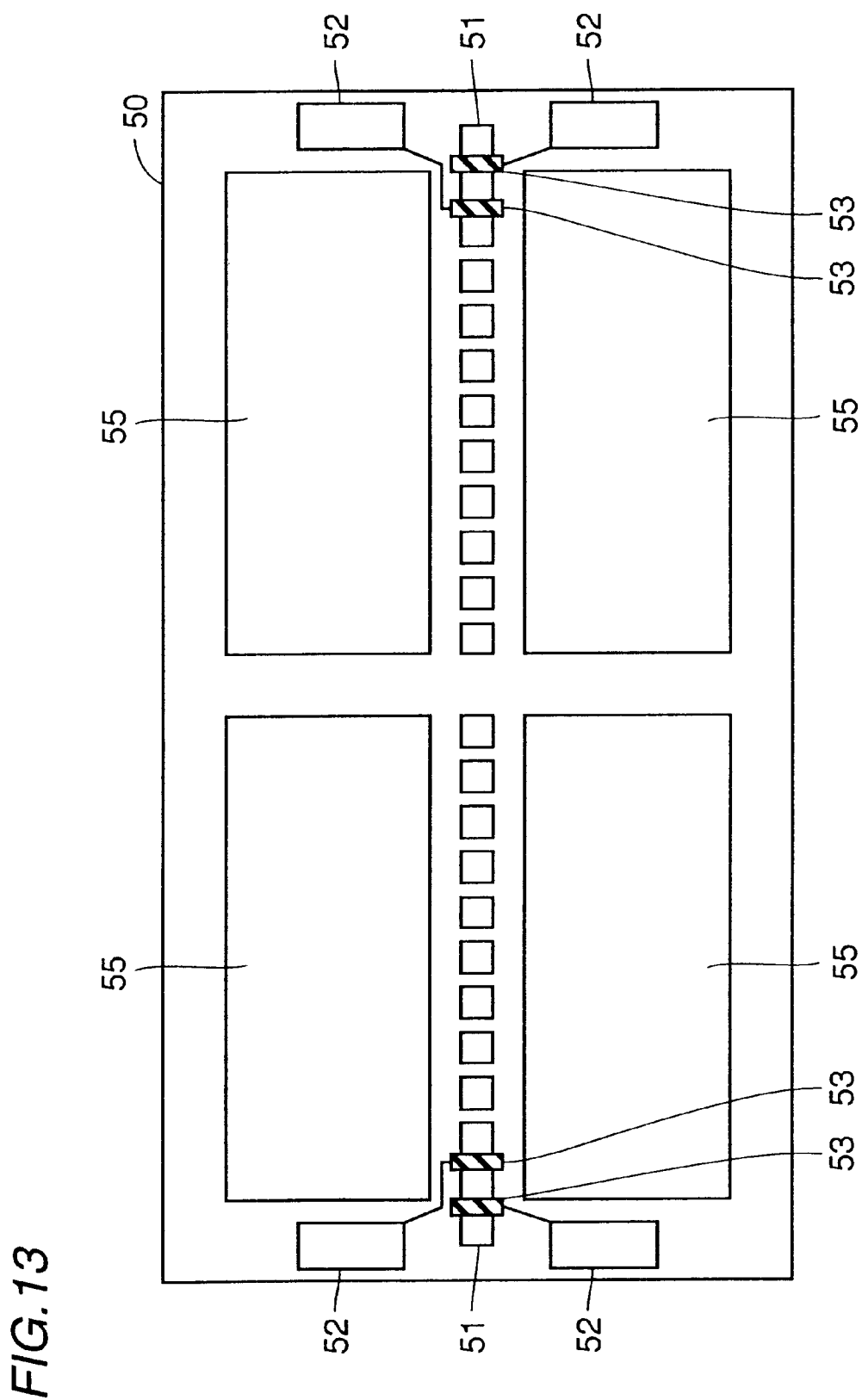
FIG. 13 represents an area for forming fuses for tuning of the power supply circuit in the semiconductor memory device in accordance with the second embodiment of the present invention.
Figure 14:
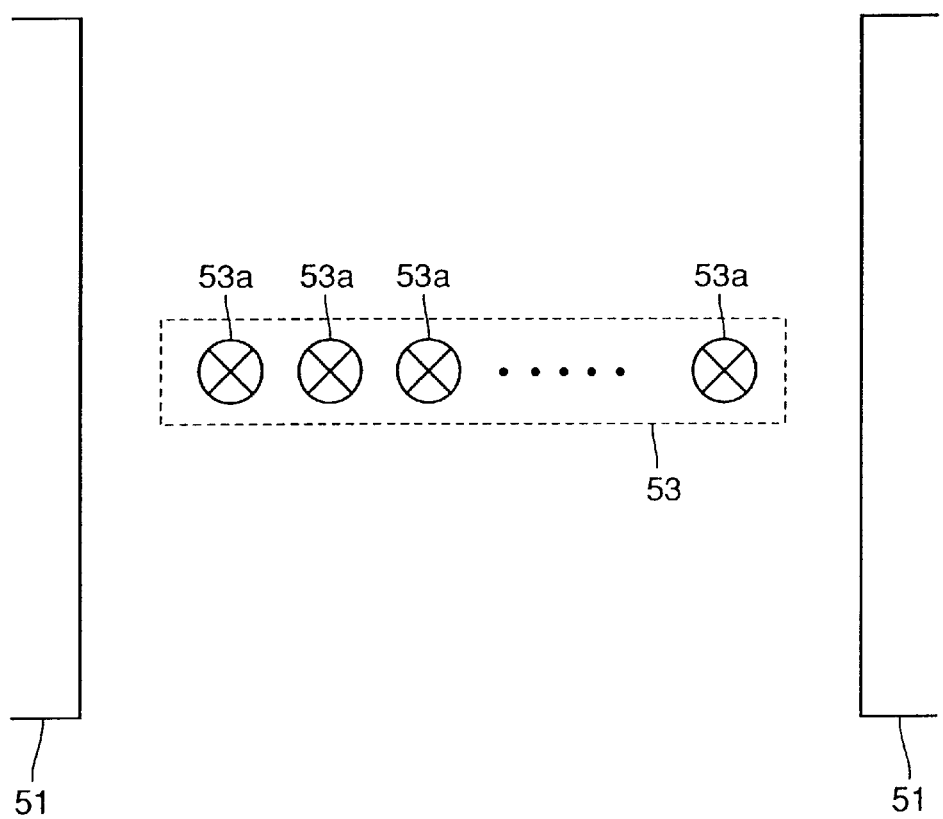
FIG. 14 shows, in enlargement, the area for forming fuses arranged between pads of FIG. 13.
Figure 15:
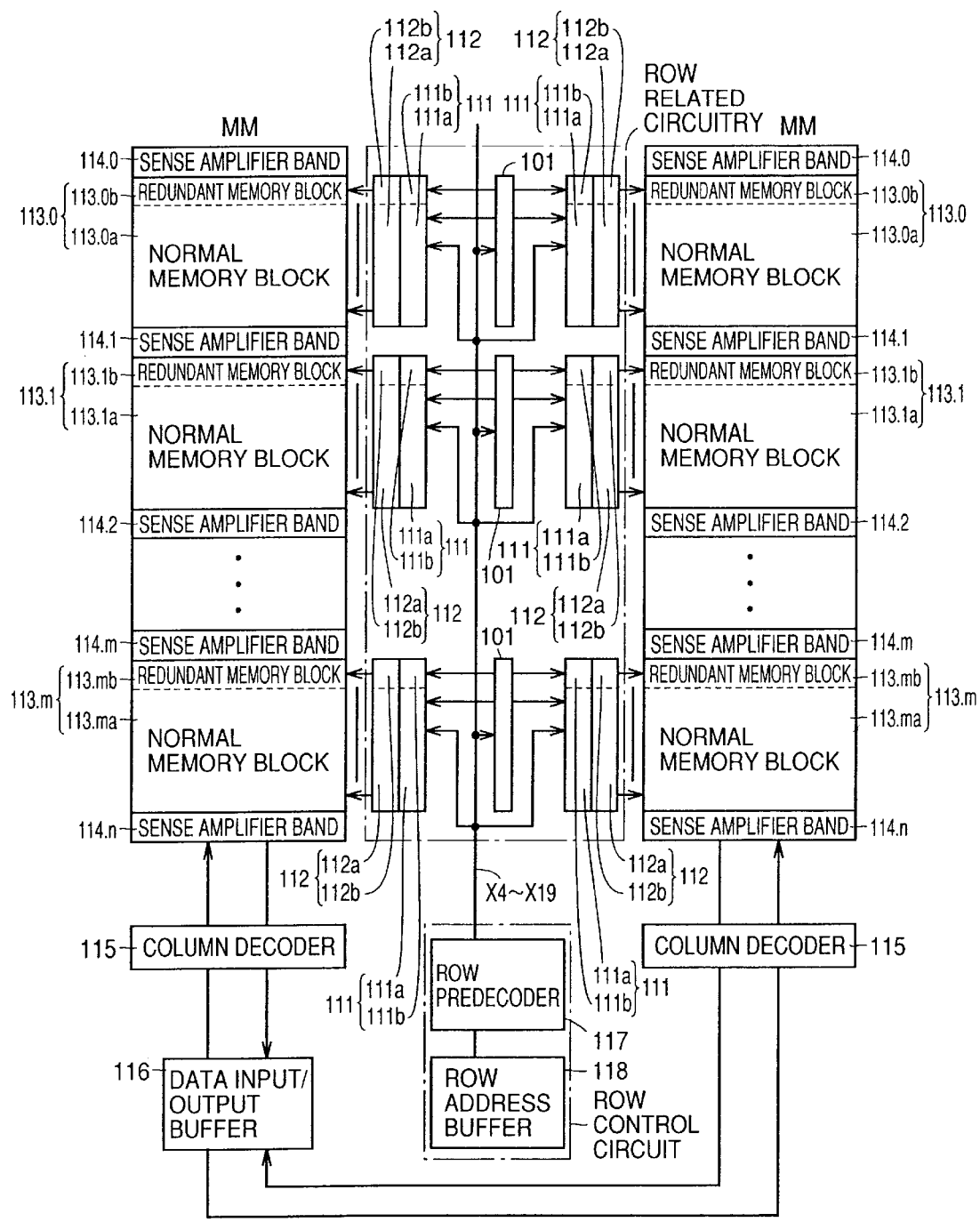
FIG. 15 is a block diagram representing a configuration of a conventional semiconductor memory device.
Figure 16:
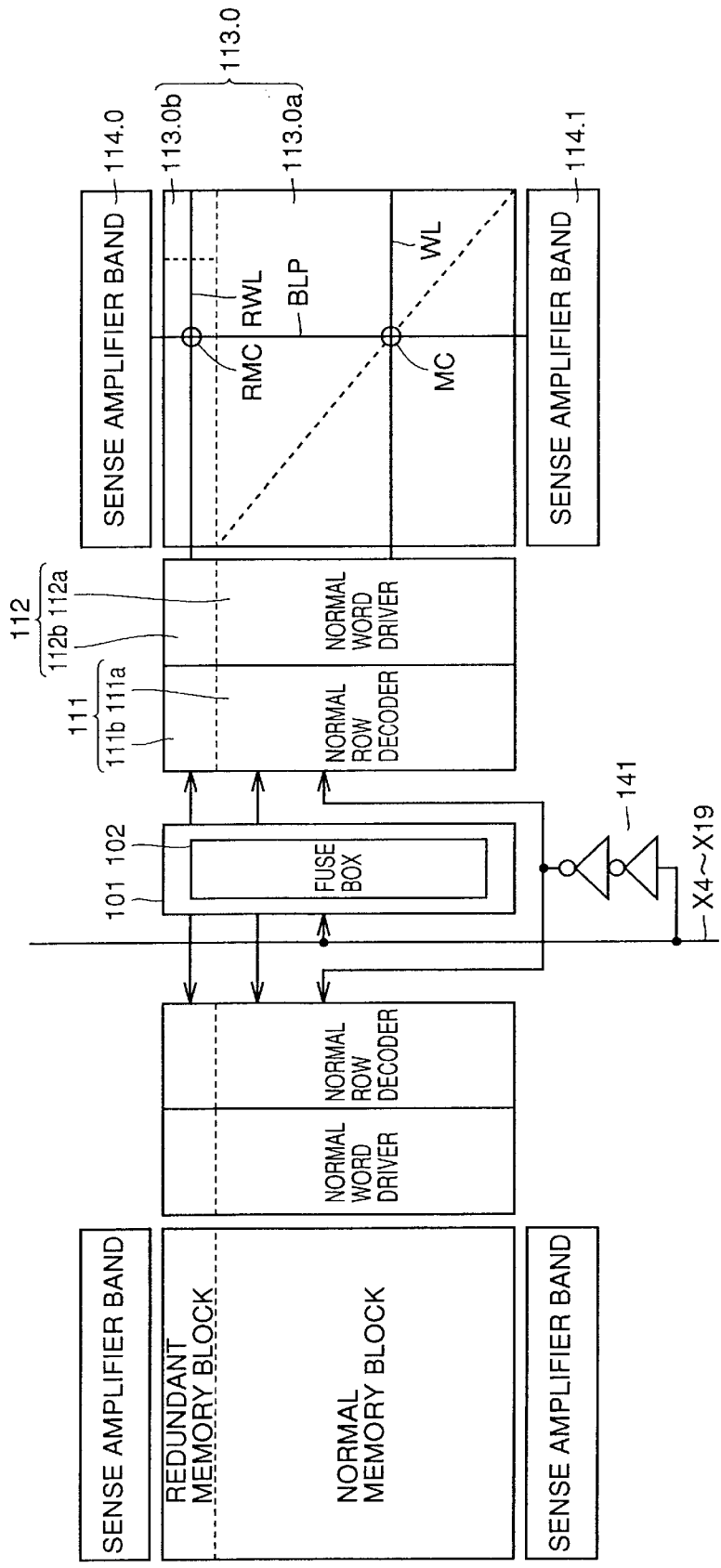
FIG. 16 specifically shows a configuration of the memory block.
Figure 17:
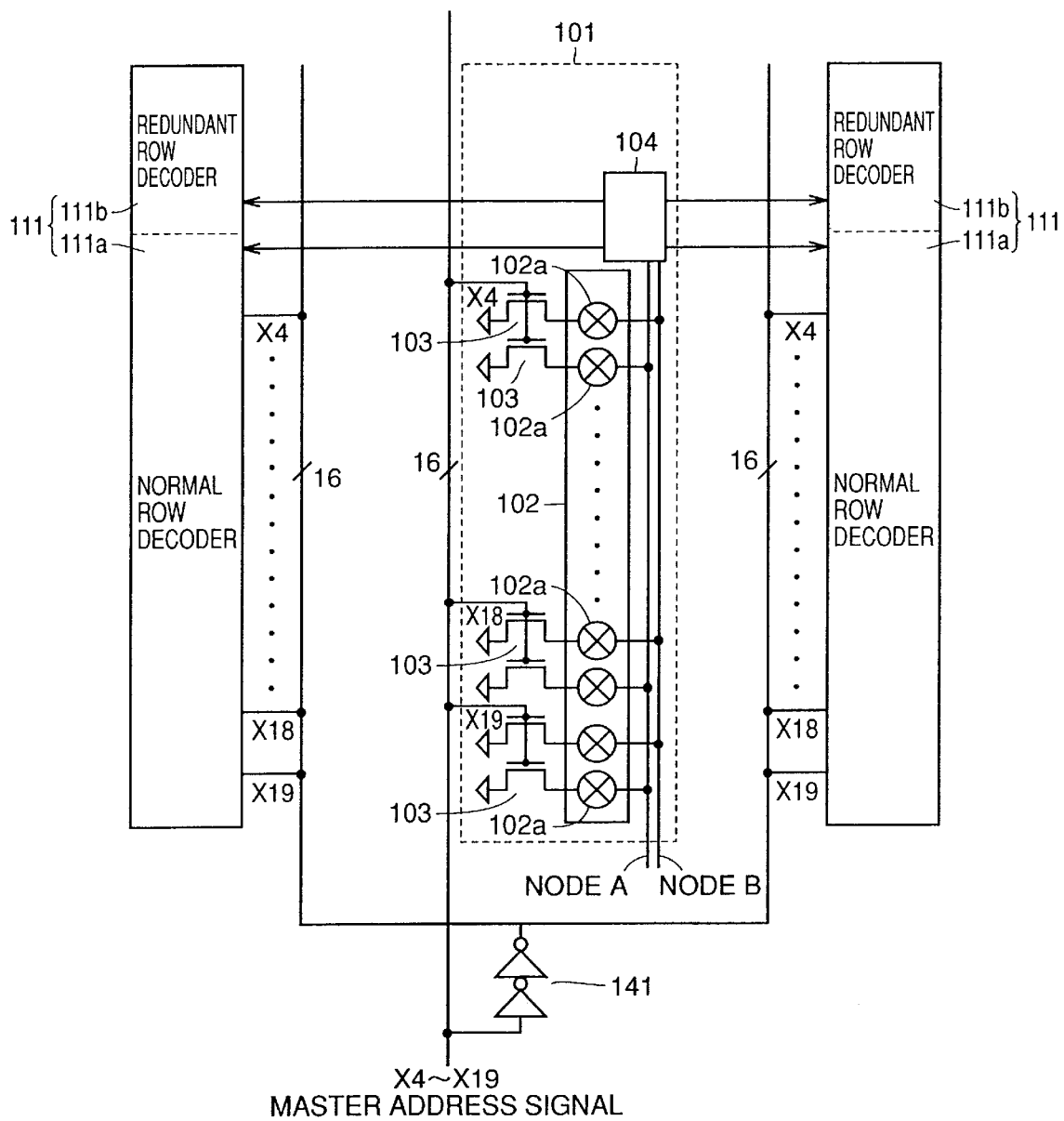
FIG. 17 specifically shows a configuration of the redundancy determining unit.

Referring to FIGS. 13 and 14, in the present embodiment, the fuse forming area 53 for tuning circuit 52 is arranged between adjacent pads 51. The pad 51 is a portion connected to a wire by wire bonding or the like. Therefore, the pad 51 is susceptible to stress at the time of wire bonding, and hence circuits are not generally arranged in the vicinity of pad 51, and therefore, the vicinity of the pad have not effectively been utilized. The fuse forming area 53 for tuning the circuit 52 is arranged between adjacent pad 51 in the present embodiment, so that the area between adjacent pads 51 can be effectively utilized, and other lines and circuits can be efficiently arranged on the outer periphery of chip 50.

Further, fuse 53a is used simply for selecting connection/non-connection of the lines. Therefore, even when there is a stress to pad 51 at the time of wire bonding, the fuse 53a is not much affected by the stress.

It should be noted that the signal line between circuit 52 and the fuse forming area 53 is made longer to some extent, when the fuse forming area 53 is placed between pads 51. Different from the fuse for redundancy determining circuit at the memory cell array portion, however, the circuit 52 operates without any problem as the state of the fuse is set in the circuit 52 at the time of power on. Further, high speed transmission of signals between the circuit 52 and the tuning fuse 53a is unnecessary. Therefore, increase in length of the signal line to some extent does not involve any problem.

Further, as the fuse 53a of which high speed signal transmission is not required for circuit 52 is arranged between adjacent pads 51, efficient layout of the chip is enabled.

The present invention is applicable not only to the reference voltage generating circuit but also to any circuit which generates a signal of a prescribed characteristic. The signal generated in the circuit is applied to an internal circuitry 55 including a memory device or the like. Tuning of the signal characteristic generated in the circuit includes not only the tuning of the voltage level as in the reference voltage generating circuit described above, but also tuning of self refresh period and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a pair of row decoders; and
   a pair of memory blocks sandwiching said pair of row decoders therebetween, each of said pair of memory blocks including a plurality of normal memory cells arranged in a matrix of rows and columns and a plurality of redundant memory cells arranged at least in one row;
   a redundancy determining circuit for replacing, independently in each of said pair of memory blocks, a row of said normal memory cells including a defective memory cell by a row of said redundant memory cells; and
   a plurality of lines for applying respective ones of a plurality of address signals for selecting a row of said normal memory cells to said redundancy determining circuit;
   wherein said redundancy determining circuit includes a first redundancy determining circuit unit for the replacement in one of said pair of memory blocks, and a second redundancy determining circuit unit for the replacement in the other one of said pair of memory blocks; and
   said plurality of lines include a center line extending in an area between said first and second redundancy determining circuit units and connected to said first and second redundancy determining circuit units.

2. The semiconductor memory device according to claim 1, wherein said redundancy determining circuit includes a plurality of fuse groups each including a plurality of fuses arranged aligned.

3. The semiconductor memory device according to claim 1, wherein said redundancy determining circuit is arranged in an area between said pair of row decoders; and said plurality of lines include a first line extending in an area between said redundancy determining circuit and one of said pair of memory blocks and connected to said redundancy determining circuit, and a second line extending in an area between said redundancy determining circuit and the other one of said pair of memory blocks and connected to said redundancy determining circuit.

4. The semiconductor memory device according to claim 3, wherein a plurality of blocks each including said pair of memory blocks, said pair of row decoders and said redundancy determining circuit arranged aligned with each other are provided;

said first line is arranged extending between said redundancy determining circuit and one of said pair of memory blocks in each of said blocks;

said second line is arranged extending between said redundancy determining circuit and the other one of said pair of memory blocks in each of said blocks; and said center line is arranged to extend in an area between said first and second redundancy determining circuit units in each of said blocks.

5. The semiconductor memory device according to claim 4, further comprising a repeater arranged in an area between adjacent ones of said blocks; wherein a branch line branched from said center line is connected to said row decoders in both of said adjacent ones of said blocks through said repeater.

6. The semiconductor memory device according to claim 4, wherein said row decoder in one of the blocks has one side area positioned on the side of the block adjacent to said one of the blocks on one side, and the other area positioned on the side of the block adjacent to said one of the blocks on the other side, said one side area of said row decoder in said one of the blocks is connected to a branch line branched from said center line through a repeater located on said one side of said one of the blocks, and the other side area of said row decoder in said one of the blocks is connected to a branch line branched from another center line through a repeater located on said other side of said one of the blocks.

7. The semiconductor memory device according to claim 1, wherein a plurality of blocks each including said pair of memory blocks, said pair of row decoders and said redundancy determining circuit arranged aligned with each other are provided; and said semiconductor memory device further comprises i) a plurality of lines for transmitting respective ones of a plurality of address signals for selecting a row of said normal memory cells to said redundancy determining circuit in each of the blocks, ii) a repeater arranged in an area between adjacent ones of said blocks, and iii) a branch line branched from one of said plurality of lines and connected to said row decoders in both of said adjacent ones of said blocks through said repeater.

8. The semiconductor memory device according to claim 1, wherein a plurality of blocks each including said pair of memory blocks, said pair of row decoders and said redundancy determining circuit arranged aligned with each other are provided;

said semiconductor memory device further comprises i) a plurality of lines for transmitting respective ones of a plurality of address signals for selecting a row of said normal memory cells to said redundancy determining circuit in each of the blocks, ii) a first repeater located on one side of one of the blocks, and iii) a second repeater located on the other side of said one of the blocks; and said row decoder in said one of the blocks includes one side area connected to a branch line branched from one of said plurality of lines through said first repeater and the other side area connected to a branch line branched from the other of said plurality of lines through said second repeater.

* * * * *